United States Patent [19]

Shirai et al.

[11] Patent Number: 4,527,730
[45] Date of Patent: Jul. 9, 1985

[54] WIRE BONDING APPARATUS

[75] Inventors: Yuji Shirai, Fuchu; Kanji Otsuka, Higashiyamato; Tamotsu Usami, Kokubunji; Yasuyuki Yamasaki, Koganei, all of Japan

[73] Assignee: Hitachi, Ltd., Tokyo, Japan

[21] Appl. No.: 461,569

[22] Filed: Jan. 27, 1983

[30] Foreign Application Priority Data

Feb. 10, 1982 [JP] Japan ................. 57-18752

[51] Int. Cl.³ ...................... B23K 37/04; B23K 1/06
[52] U.S. Cl. ........................... 228/179; 228/4.5
[58] Field of Search ................... 228/4.5, 179

[56] References Cited

U.S. PATENT DOCUMENTS

| 3,646,307 | 2/1972 | Hazel | 228/4.5 |
| 3,650,450 | 3/1972 | Larson et al. | 228/4.5 |
| 4,068,371 | 1/1978 | Miller | 228/4.5 |
| 4,230,925 | 10/1980 | Lascelles | 228/4.5 |
| 4,418,858 | 12/1983 | Miller | 228/179 |

FOREIGN PATENT DOCUMENTS 2837841 9/1977 Fed. Rep. of Germany .
2622000 12/1977 Fed. Rep. of Germany ...... 228/179

Primary Examiner—Kenneth J. Ramsey
Assistant Examiner—C. McKee
Attorney, Agent, or Firm—Antonelli, Terry & Wands

[57] ABSTRACT

A wire bonding apparatus which can variously change the shape of a loop of a bonding wire and can restrict the loop shape in accordance with specifications of an article being wire bonded. In the wire bonding apparatus, a wire guide unit moving both vertically and transversely, independently of a bonding tool, is disposed in proximity of the bonding tool which moves relative to the article to be wire bonded and which connects the wire between a first bonding region and the second bonding region. A mechanism is provided which changes the shape of the loop of the bonding wire when the wire guide unit moves vertically and transversely.

8 Claims, 10 Drawing Figures

WIRE BONDING APPARATUS

BACKGROUND OF THE INVENTION

The present invention relates to a wire bonding apparatus and, more particularly, to a wire bonding apparatus which can shape the loop of a bonding wire into a desired shape and stabilize the shape of the loop.

As the integration of semiconductor integrated circuits becomes higher, the number of external leads and pins of the semiconductor integrated circuit devices also becomes greater; however, the number of the electrode pads or wire bonding regions and electrically conductive leads disposed around a chip on which the semiconductor devices are formed, is restricted by virtue of the size and shape of the chip or the size and shape of the package. Consequently, there is a certain limit to the increase of the number of pins and, at present, for a chip size of 12×12 mm, the number of pins is at most 208.

Attempts have been made to increase the number of pins of semiconductor integrated devices by forming electrode pads as planar shaped parallelograms so as to reduce a pitch between adjacent pads; however, a disadvantage resides in the fact that such attempts are inevitably restricted by the working properties and reliability of the wire bonding when the wire is bonded to the pads.

In accordance with another proposal, the electrode pads and leads to be formed on the chip are arranged in a zig zag pattern so as to substantially decrease the pad pitch; however, a disadvantage of this proposal resides in the fact that, if the pad pitch is reduced, the adjacent wires come closer to each other and eventually may be brought into contact thereby resulting in the development of short circuits. Because of the shape of the loop of the bonding wire formed between the electrode pad or a first bonding region and a lead or second bonding region in the wire bonding apparatus is primarily determined by the control of the vertical movement of the wire connecting tool of the wire bonding apparatus, that is, by a Z axis control, and by the wire hardness, the wire bonding apparatus is less able to change the shape of the loop and the stability of the loop itself is relatively low thereby resulting in the short circuit problem noted above.

SUMMARY OF THE INVENTION

The present invention essentially resides in providing a wire bonding apparatus which easily shapes any desired loop in the bonding wire, facilitates a changing of the shape of the loop, and improves the stability of the loop so as to enable an increase in the number of pins provided in semiconductor integrated circuit devices.

In accordance with advantageous features of the present invention, a wire bonding apparatus is provided which includes a wire guide unit capable of operating independently of the bonding tool, with the wire guide unit being disposed in proximity of the bonding tool such as, for example, a wire connecting tool of a wire bonding apparatus so that wire bonding can be carried out while the shape of the loop of the bonding wire is restricted by temporarily hooking the wire on the wire guide unit.

Advantageously, in accordance with the present invention, the wire guide unit is supported by an XYZ moving mechanism operating independently of the bonding head.

For the purpose of altering or changing the shape of the wire loop, the wire guide unit may, in accordance with the present invention, be provided at an end thereof with a hook means which is adapted to hook a portion of the wire to be bonded.

It is also possible in accordance with the present invention, for the wire guide unit to be provided with a clamp means at an end thereof, with the clamp means being adapted to clamp a portion of the wire so as to vary or alter the shape of the wire loop between the first bonding region and second bonding region during a bonding operation of the wire.

The bonding of the wire may, for example, be accomplished by an ultrasonic type bonding use a wedge as the bonding tool; however, it is also possible to utilize a thermal-compression bonding utilizing a capillary as a bonding tool.

Accordingly, it is an object of the present invention to provide a wire bonding apparatus whereby a wire bonding operation can be carried out while a loop of the bonding wire is formed and temporarily maintained.

Another object of the present invention resides in providing a wire bonding apparatus wherein the desired loop shape of the bonding operation is easily accomplished.

A still further object of the present invention resides in providing a wire bonding apparatus which enables an altering in a shape of a wire loop in an extremely simple manner.

Yet another object of the present invention resides in providing a wire bonding apparatus which makes it possible to achieve a high integration of semiconductor devices.

These and other objects, features, and advantages of the present invention will become more apparent from the following description when taken in connection with the accompanying drawings which show, for the purpose of illustration only, several embodiments in accordance with the present invention.

DESCRIPTION OF THE PREFERRED EMBODIMENTS

Figure 1:
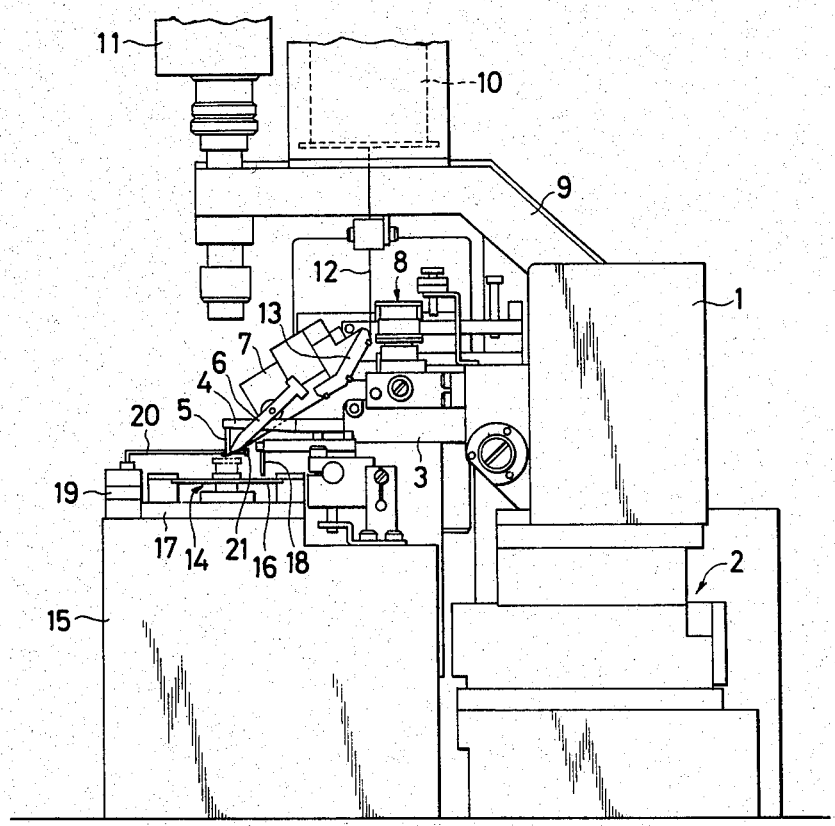
FIG. 1 is a schematic front view of the wire bonding apparatus in accordance with one embodiment of the present invention.

Referring now to the drawings wherein like reference numerals are used throughout the various views to designate like parts and, more particularly, to FIG. 1, according to this figure, a wire bonding apparatus includes a bonding head 1 mounted on an XY table generally designated by the reference numeral 2 and adapted to move in the horizontal X-Y directions. An ultrasonic oscillator 3, electrically connected to an ultrasonic oscillation source (not shown), is disposed in front of the bonding head 1, and a transducer 4, acting as an oscillation body, projects forward from the front part of the oscillator 3. A wedge 5, acting as a bonding tool, is fitted to a tip of the transducer 4 so as to project in a downward direction. A clamp 6 is supported by support blocks 7 above the transducer 4 in such a manner that jaws of the clamp 6 are positioned immediately behind the wedge 5 as shown most clearly in FIG. 2. The transducer 4 and the clamp 6 may, for example, be actuated by a cam mechanism generally designated by the reference numeral 8 disposed in front of the bonding head 1 so that the transducer 4 moves its tip up and down while the clamp 6 opens and closes its jaws.

Figure 2:
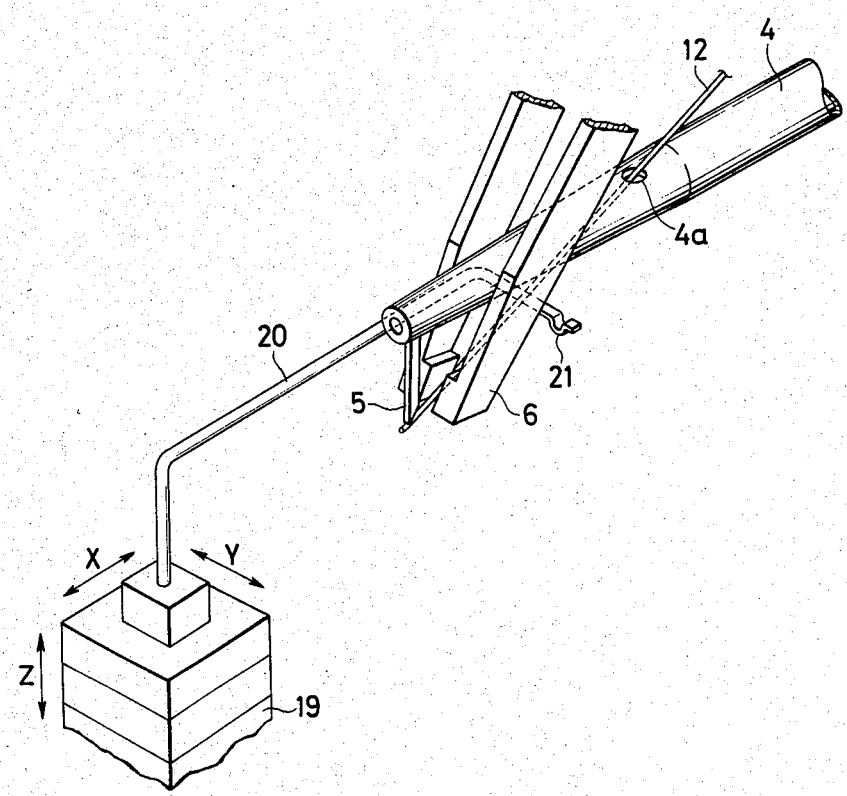
FIG. 2 is a perspective view showing the principal parts of the wire bonding apparatus shown in FIG. 1.

A support arm 9 extends from the upper part of the bonding head 1 and supports a wire coil 10 and an industrial television camera 11 fitted thereto. The wire coil 10 consists of, for example, an aluminum wire which forms the bonding wire 12 and is wound on a bobbin or the like. The end of the wire 12, pulled or extending out from the lower part of the wire coil 10, is hooked around a wire guide 13 fitted to the support box 7 and, as shown in FIG. 2, is passed through a hole 4a in the transducer 4, then between the jaws of the clamp 6, and further through a hole (not shown) defined at a tip of the wedge 5. The industrial television 11 views the scene in proximity of the wedge 5 and shows the electrode pads of a chip 23 (FIG. 4) and inner leads of a workpiece generally designated by the reference numberal 14, forming the article to be bonded, on a television moinitor (not shown).

As further shown in FIG. 1, a bonding stage 15 is disposed in front of the bonding head 1 and a feeder unit 17 is disposed on the bonding stage 15, with the feeder unit 17 being adapted to sequentially convey a carrier jig 16, continuously supporting a plurality of workpieces 14 thereon, in a direction perpendicular to the plane of the drawing. A feed pawl 18 also is provided and forms a part of the sequential conveyor mechanism. A compact XYZ table 19 is disposed above and in front of the bonding stage 15 and a wire guide unit 20, having an end 20a bent substantially into an L shape, as shown in FIG. 2, is fitted to the uppermost portion of the XYZ table 19. The end 20a of the wire guide unit 20 is normally positioned immediately behind the wedge 5 and the clamp 6 and is provided with an upwardly recessed hook 21. The XY table 2, the cam mechanism 8, the compact XYZ table 19, etc. are controlled by a computer in a conventional manner in a control unit (not shown).

The wire bonding method using the wire bonding apparatus described above will be described with reference to FIGS. 3A-3D wherein an outer lead 22 and an inner lead 26 are arranged on a surface of a base 100 of a package, with the chip 23 being fixed to the base 100. The inner and outer leads 22, 23, base 100 and chip 23 form the workpiece 14 described above. In particular, in the illustrated embodiment, the electrode pads 24, 25 are formed on the chip 23 in two lines or rows.

Figure 3A:
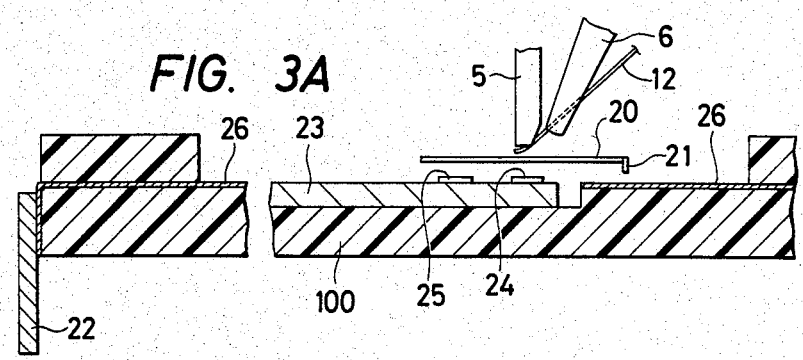
FIGS. 3A through 3D are front views, each showing a wire bonding step when using the wire bonding apparatus shown in FIG. 1.
Figure 3B:
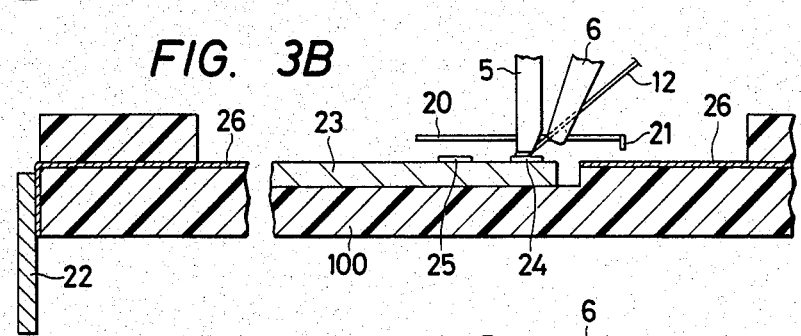
Figure 3C:
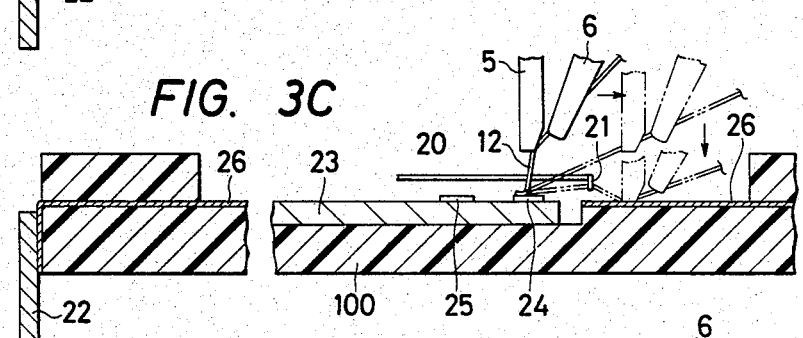

Referring initially to FIG. 3A, the wedge 5 is first moved into an area of an electrode pad 24 on the outside of the chip 23 as the first bonding region and is then pressed into contact with the electrode pad 24 as shown in FIG. 3B so as to bond the wire 12 by ultrasonics. Meanwhile, the wire guide unit 20 is kept back behind the wedge 5. Next, as shown in FIG. 3C, the wedge 5 is moved some distance upward and is then moved toward the inner lead 26, that is, to the right in the drawing. When the wedge 5 reaches the position of the inner lead 26 as the second bonding region, the wedge 5 is moved in a downward direction so as to connect the other end of the wire to the inner lead 26. In this case, the hook 21 of the wire guide unit 20 is moved some distance to the left so that it is positioned between the electrode pad 24 and the inner lead 26 and an intermediate part of the wire 12, connected between the electrode pad 24 and inner lead 26, is hooked as shown by the phantom line in FIGS. 3C and 3D. Accordingly, the shape of the loop in the wire is determined by the position of the hook 21 at this time and any variation of the loop resulting from differences of the wire hardness or winding properties can be eliminated.

In this case, the height and transverse position of the hook 21 are naturally controlled by the XYZ table 19. After the wire bonding to the inner lead 26 is completed, the wire 12 is cut by the clamping action of the clamp 6 and by the upward movement of the wedge 5 as shown in FIG. 3D thereby completing the wire bonding operation.

Figure 3D:
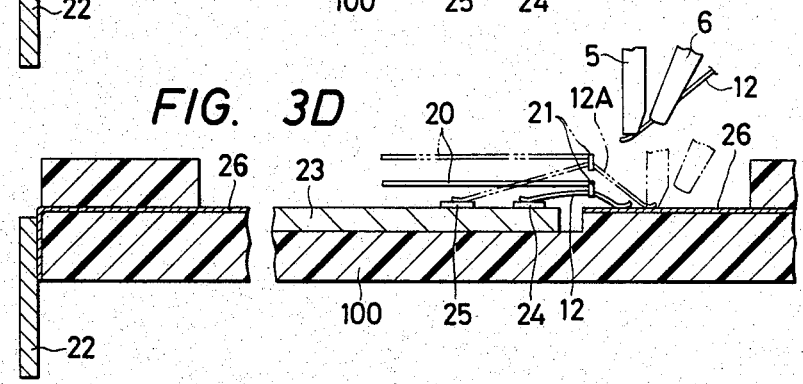

In the illustrated embodiment, the steps shown in FIGS. 3A and 3B are carried out once again, this time to connect the wire to the inner electrode pad 25 and thereafter the other end of the wire 12A is connected to the outer position of the inner lead 26 as shown by the phantom lines in FIG. 3D. In this case, the hook 21 of the wire guide unit 20 is held at a position higher than a previous position so as to hook an intermediate part of the wire 12A. Thus, the wire 12A is shaped in the loop over the previous wire 12 so as to bridge the same.

Figure 4:
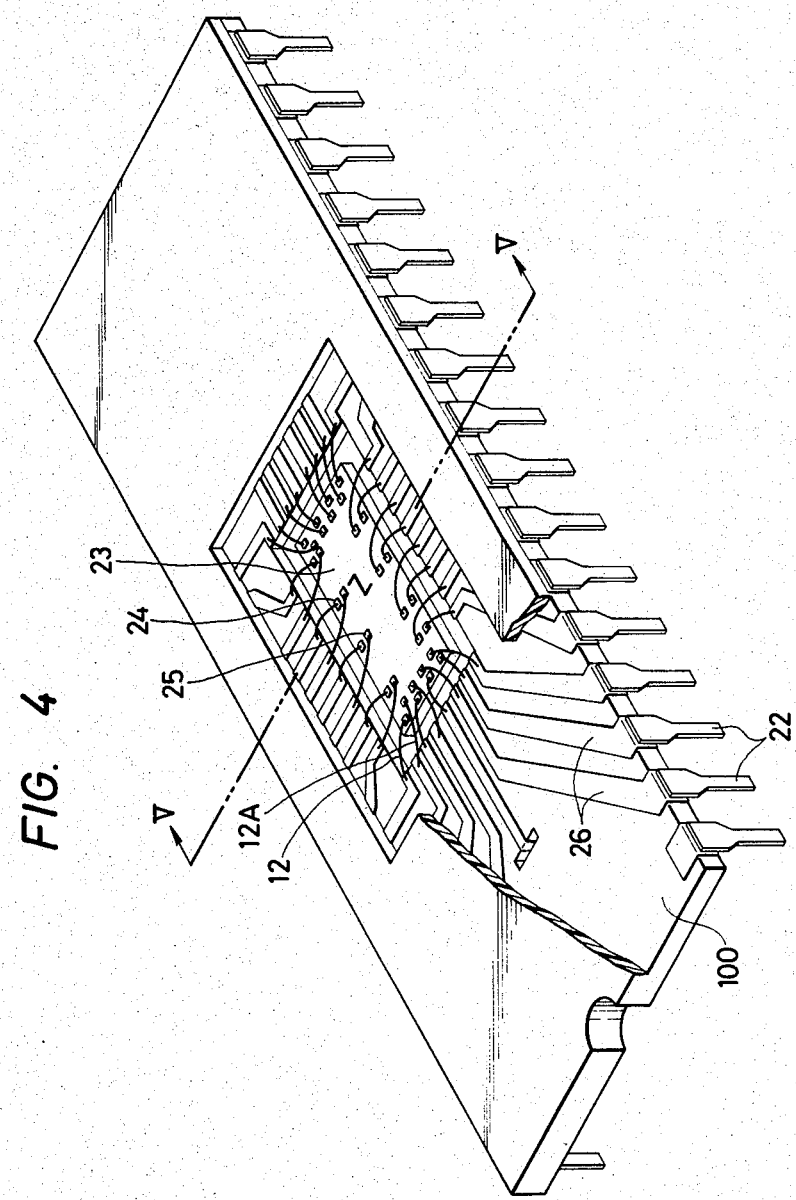
FIG. 4 is a perspective view showing a semiconductor device to which wire bonding is effected by the use of the wire bonding apparatus of the present invention.
Figure 5:
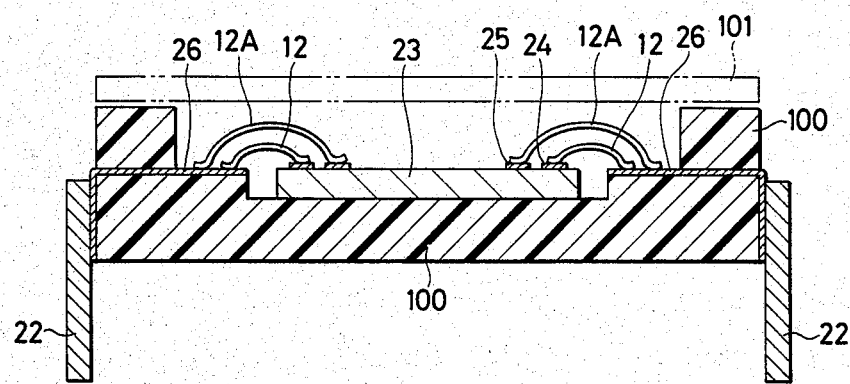
FIG. 5 is a cross-sectional view taken along the line V—V of FIG. 4.

As shown in FIGS. 4 and 5, in the chip 23, wire-bonded as described above, the inner and outer electrode pads 24, 25 and the inner lead 26 can be connected to one another by wires 12, 12A, that do not cross one another in substantially the same vertical plane. In this instance, the loop of each wire 12, 12A, is formed by hooking an intermediate part of the wire by the hook 21 of the wire holding unit 20 and hence the loop can be stabilized with coming into contact with the other loops. As a result, it is no longer necessary to reduce the size of the electrode pad 24, 25 and thus reduce the pad pitch, and a higher density of wire bonding, an increase in the number of pins, and an improvement in the realiability of the semiconductor device can be accomplished. Incidentally reference numeral 101 in FIG. 5 represents the package cap.

The XYZ table 19 supporting the wire holding unit 20 operates in an interconnected sequence with the XY table 2 and with the cam mechanism 8 and controls the wire holding unit 20 and, in particular, the height and transverse position of the hook 21. It is preferred in this case that data on the moving positions and timing are inputted in advance in accordance with the specifications of the article being bonded, and control is effected on the basis of the data thus stored.

Figure 7:
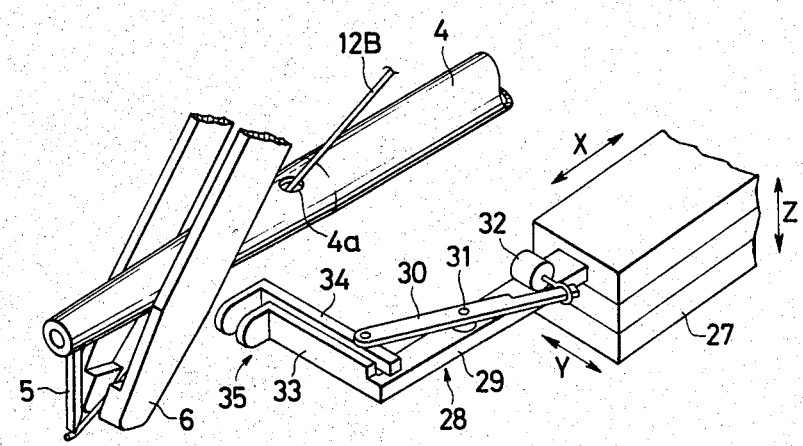
FIG. 7 is an enlarged perspective view showing the principal part of the wire bonding apparatus shown in FIG. 6.
Figure 6:
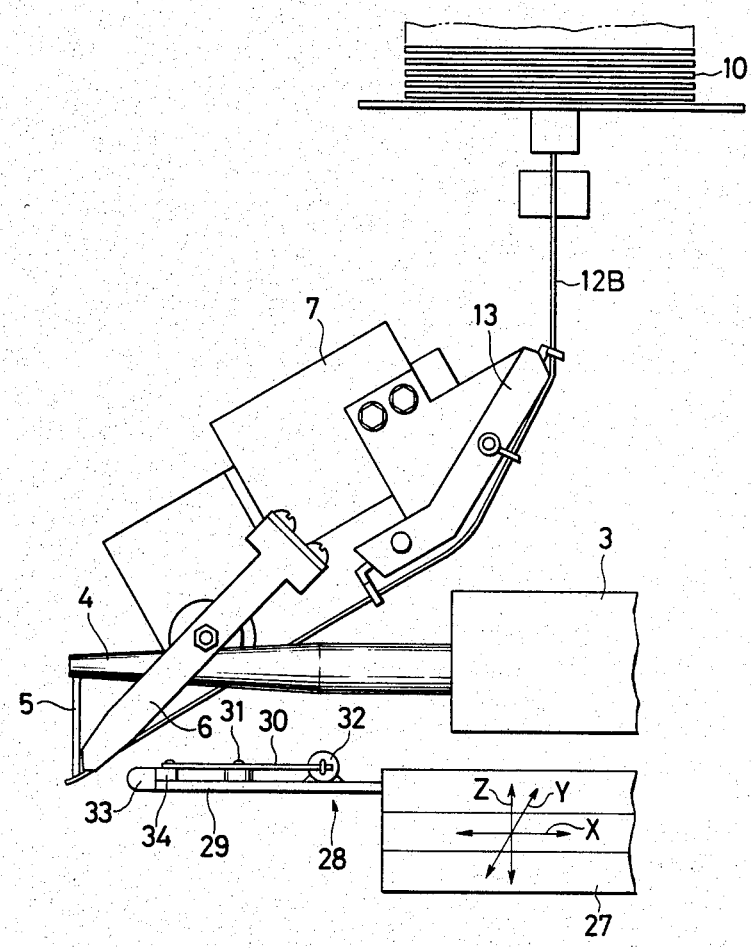
FIG. 6 is a front view showing the wire bonding apparatus in accordance with another embodiment of the present invention.

FIGS. 6 and 7 show another embodiment of the present invention in which the wire guide unit in particular is modified. An XYZ moving mechanism 27 such as the XYZ table or the like is disposed in front of the bonding head 1 at the position at which the transducer 4 slants downward, and a wire holding unit generally designated by the reference numeral 28 projects forward from the front end of the XYZ moving mechanism 27. A rocking link 30 is turnably supported by a pivot 31 on the upper part of a main arm 29 of the wire guide unit 28 and can be made to rock by activation of an electromagnetic solenoid 32. An end clamping unit generally designated by the reference numeral 35 includes a movable clamp 34 disposed in opposition to a fixed clamp 33. The movable clamp 34 is fashioned as a substantially L-shaped portion at the end of the main arm 29. The movable clamp 34 is connected to the other end of the rocking link 30 so that the movable clamp 34 is actuated by the rocking of the rocking link to clamp part of the wire between it and the substantially L-shaped fixed clamp 33.

According to the construction described above, after the wire is bonded by the wedge 5 in cooperation with the clamp 6 as shown in FIGS. 3A and 3B, the wire guide unit 28 causes the end clamping unit 35 to project to an intermediate position of the wire 12B by the operation of the XYZ moving mechanism 27 so that the intermediate part of the wire 12B is clamped and fixed by the fixed and movable clamps 33 and 34. The wedge 5 then connects the other end of the wire to the inner lead, forming the wire loop. In this instance the desired loop can be formed by restricting an intermediate part of the wire by the operation of the wire guide unit 28, in the same way as in the foregoing embodiment.

In the embodiment of FIGS. 6 and 7, since the wire guide unit 28 partly clamps an intermediate part of the wire 12B, the wire tension is prevented from acting upon the electrode pad of the chip at the first bonding region when connecting the wire to the inner lead at the second bonding regions so that breakages of the pad, etc., can be prevented. Since the wire guide unit 28 has a substantially L-shaped coverall configuration, it does not interfere with the wedge 5, etc.

In the embodiment of FIGS. 6 and 7, as with the previously described embodiment, the shape of the wire loop can be controlled as required. In other words, wire bonding of wire loops such as is shown in FIGS. 4 and 5 can be made and thus is extremely effective for increasing the number of pins and the density of the semiconductor device.

Although the foregoing embodiments have, by way of example, been described as utilizing an ultrasonic bonding apparatus, the present invention can of course be applied to a wire bonding apparatus using a thermo compression bonding method employing a capillary as the bonding tool.

While we have shown and described several embodiments in accordance with the present invention, it is understood that the same is not limited thereto but is susceptible of numerous changes and modifications as know to one having ordinary skill in the art and we therefore do not wish to be limited to the details shown and described herein, but intend to cover all such modifications as are encompassed by the scope of the appended claims.

We claim:

1. A wire bonding apparatus comprising a bonding tool means for bonding a wire at a first bonding region and a second bonding region of an article to be wire bonded, wire guide means disposed in proximity of said bonding tool means for guiding the wire to be bonded, means for moving the bonding tool means relative to the article to be wire bonded, means for moving the wire guide means vertically and transversely independently of a movement of the bonding tool means, the wire guide means including means for altering a shape and a length of a wire loop defined between the first bonding region and the second bonding reion during a bonding of the wire, said means for altering including clamp means arranged at the end of said wire guide means for clamping a portion of the wire.

2. The wire bonding apparatus as defined in claim 1, wherein said means for moving the wire guide means includes an XYZ moving mechanism operating independently of said bonding tool means.

3. The wire bonding apparatus as defined in claim 2, wherein said means for altering includes a hook means arranged at an end of the wire guide means and adapted to hook a portion of the wire.

4. The wire bonding apparatus as defined in claim 2, wherein said bonding tool means includes a wedge means for enabling an ultrasonic wire bonding operation.

5. The wire bonding apparatus as defined in claim 2, wherein said bonding tool means includes a capillary means for enabling a thermocompression wire bonding operation.

6. A wire bonding apparatus comprising a bonding tool means for bonding a wire at a first bonding region and a second bonding region of an article to be wire bonded, wire guide means disposed in proximity of said bonding tool means for guiding the wire to be bonded, means for moving the bonding tool means relative to the article to be wire bonded, means for moving the wire guide means vertically and transversely independently of a a movement of the bonding tool means, the wire guide means including means for altering a shape of a wire loop defined between the first bonding region and the second bonding region during a bonding of the wire, said means for altering includes a main arm operatively connected to said means for moving the wire guide means, a fixed clamp member provided at a free end of said main arm, a movable clamp member mounted on said main arm, and means for selectively moving said movable clamp member so as to enable a clamping of the wire between said fixed and movable clamp members.

7. The wire bonding apparatus as defined in claim 6, wherein said means for selectively moving said movable clamp member includes a link member pivotally mounted on said main arm, and means for pivoting said link member.

8. The wire bonding apparatus as defined in claim 7, wherein said means for pivoting said link member includes a solenoid means.

* * * * *